(12) United States Patent
Kumagai et al.

(10) Patent No.: US 6,232,670 B1
(45) Date of Patent: May 15, 2001

(54) SEMICONDUCTOR MEMORY DEVICE AND METHOD OF FABRICATING THE SAME

(75) Inventors: Takashi Kumagai, Chino; Junichi Karasawa, Tatsuno-machi; Kazuo Tanaka; Kunio Watanabe, both of Sakata, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/361,043

(22) Filed: Jul. 26, 1999

(30) Foreign Application Priority Data

Jul. 27, 1998 (JP) .................................................. 10-226484

(51) Int. Cl.[7] .................................................. H01L 27/11
(52) U.S. Cl. .......................... 257/903; 257/288; 257/368
(58) Field of Search .................................. 257/903, 288, 257/368

(56) References Cited

U.S. PATENT DOCUMENTS

| | | | |
|---|---|---|---|
| 5,811,858 | * 9/1998 | Ohkubo | 257/369 |
| 5,930,163 | * 7/1999 | Hara et al. | 365/154 |
| 6,005,296 | * 12/1999 | Chan | 257/904 |
| 6,140,684 | * 10/2000 | Chan et al. | 257/368 |

* cited by examiner

*Primary Examiner*—Eddie C. Lee
*Assistant Examiner*—N. Drew Richards
(74) *Attorney, Agent, or Firm*—Hogan & Hartson, LLP

(57) ABSTRACT

First and second memory cells of an SRAM comprises first, second, and third conductive layers. The first conductive layer is a gate electrode for a first load transistor and a first driver transistor. The second conductive layer diverges from the first conductive layer on a field oxide region and is electrically connected to a second driver transistor active region. The third conductive layer is a gate electrode for a second load transistor and a second driver transistor. The third conductive layer is electrically connected to a first load transistor active region. The pattern of the first, second, and third conductive layers of the second memory cell is a rotated pattern of the first, second, and third conductive layers in the first memory cell at an angle of 180 degrees around an axis perpendicular to the main surface of a semiconductor substrate.

12 Claims, 20 Drawing Sheets

SEMICONDUCTOR MEMORY DEVICE AND METHOD OF FABRICATING THE SAME

BACKGROUND OF THE INVENTION

1. Field of the Invention

The present invention relates to a semiconductor memory device, in particular, an SRAM and a method of fabricating the same.

2. Description of Background Art

A six transistor-type SRAM comprises memory cells including two load transistors, two driver transistors, and two transfer transistors. Active regions of each memory cell are isolated from active regions of the adjoining cells by an element isolation region comprising a field oxide layer and the like.

A phenomenon in which current flows between the element isolation regions is referred to as punch-through. Punch-through causes malfunction of the SRAM. According to the demand for a reduced cell size, the width of the element isolation region has become narrower. Punch-through occurs more easily as the width of the element isolation region becomes narrower.

SUMMARY OF THE INVENTION

The present invention has been achieved to overcome the above problems. An object of the present invention is to provide a semiconductor memory device which can prevent punch-through between memory cells, and a method of fabricating the same.

The semiconductor memory device according to the first aspect of the present invention including: a semiconductor substrate having a main surface; and first and second load transistors and first and second driver transistors formed on the main surface, comprises first and second memory cells and a second element isolation region.

Each of the first and second memory cells comprises:

a first load transistor active region formed on the main surface and to be an active region for the first load transistor;

a second load transistor active region formed on the main surface and to be an active region for the second load transistor;

a first driver transistor active region formed on the main surface and to be an active region for the first driver transistor;

a second driver transistor active region formed on the main surface and to be an active region for the second driver transistor;

a first element isolation region formed on the main surface and isolating the first load transistor active region from the first driver transistor active region;

a first conductive layer extending from an area on the first load transistor active region to an area on the first driver transistor active region, and to be a gate electrode for the first load transistor and the first driver transistor;

a second conductive layer which diverges from the first conductive layer on the first element isolation region and is electrically connected to the second driver transistor active region; and a third conductive layer being electrically connected to the first load transistor active region and extending to an area on the second driver transistor active region across an area on the second load transistor active region, and to be a gate electrode for the second load transistor and the second driver transistor.

The second element isolation region is formed on the main surface and isolates the first and second load transistor active regions of the first memory cell from the first and second load transistor active regions of the second memory cell.

A pattern of the first, second, and third conductive layers of the second memory cell is a rotated pattern of the first, second, and third conductive layers of the first memory cell at an angle of 180 degrees around an axis perpendicular to the main surface.

Such a rotated pattern at 180 degrees can prevent punch-through between the first and second load transistor active regions of the second memory cell and the first and second load transistor active regions of the first memory cell.

Specifically, the distance between a drain region in the first and second load transistor active regions of the first memory cell and a drain region in the first and second load transistor active regions of the second memory cell can have almost the same value as the sum of the widths of the second element isolation region and the third conductive layer. The existence of the third conductive layer can make this distance larger, so that punch-through can be prevented in this region.

According to the second aspect of the present invention, a semiconductor memory device, comprising a memory cell array having a plurality of memory cells including first and second load transistors and first and second driver transistors, has the following configuration.

Each of the memory cells comprises:

a semiconductor substrate having a main surface;

a first load transistor active region formed on the main surface and to be an active region for the first load transistor;

a second load transistor active region formed on the main surface and to be an active region for the second load transistor;

a first driver transistor active region formed on the main surface and to be an active region for the first driver transistor;

a second driver transistor active region formed on the main surface and to be an active region for the second driver transistor;

a first element isolation region formed on the main surface and isolating the first load transistor active region from the first driver transistor active region;

a first conductive layer extending from an area on the first load transistor active region to an area on the first driver transistor active region, and to be a gate electrode for the first load transistor and the first driver transistor;

a second conductive layer which diverges from the first conductive layer on the first element isolation region and is electrically connected to the second driver transistor active region; and a third conductive layer being electrically connected to the first load transistor active region and extending to an area on the second driver transistor active region across an area on the second load transistor active region, and to be a gate electrode for the second load transistor and the second driver transistor.

The memory cell array comprises:

first and second lines including the memory cells; and a second element isolation region which isolates the first line from the second line.

A pattern of the first, second, and third conductive layers of each of the memory cells in the second line is a rotated pattern of the first, second, and third conductive layers of each of the memory cells in the first line at an angle of 180 degrees around an axis perpendicular to the main surface.

The configuration of the semiconductor memory device according to the second aspect of the present invention is from the viewpoint of a memory cell array. Punch-through can be prevented for the same reason as described in the previous aspect.

The semiconductor memory device according to the second aspect of the present invention preferably has the following configuration. The second load transistor active region of each of the memory cells in the first line comprises a first facing region which faces the first load transistor active region of each of the memory cells in the second line with the second element isolation region interposing therebetween, and a pattern of the third conductive layer of each of the memory cells in the first line is formed across an area on the first facing region. The second load transistor active region of each of the memory cells in the second line comprises a second facing region which faces the first load transistor active region of each of the memory cells in the first line with the second element isolation region interposing therebetween, and a pattern of the third conductive layer of each of the memory cells in the second line is formed across an area on the second facing region.

The pattern of the third conductive layer of each of the memory cells in the first line is formed across an area on the first facing region. Therefore, the existence of the third conductive layer can make the distance between a drain region in the first load transistor active region of each of the memory cells in the second line, and a drain region in the second load transistor active region of each of the memory cells in the first line larger. Specifically, this distance can have almost the same value as the sum of the widths of the second element isolation region and the third conductive layer of each of the memory cells in the first line. Punch-through therefore can be prevented in this region.

The pattern of the third conductive layer of each of the memory cells in the second line is formed across an area on the second facing region. Therefore, the existence of the third conductive layer can make the distance between a drain region in the second load transistor active region of each of the memory cells in the second line, and a drain region in the first load transistor active region of each of the memory cells in the first line larger. Specifically, this distance can have almost the same value as the sum of the widths of the second element isolation region and the third conductive layer of each of the memory cells in the second line. Punch-through therefore can be prevented in this region.

In the semiconductor memory device according to the second aspect of the present invention, it is preferable that a first side wall insulating layer is formed on a side of the third conductive layer of each of the memory cells in the first line; the first side wall insulating layer is positioned in an area on the first facing region; a second side wall insulating layer is formed on a side of the third conductive layer of each of the memory cells in the second line; and the second side wall insulating layer is positioned in an area on the second facing region.

In the semiconductor memory device according to the second aspect of the present invention, it is preferable that part of the third conductive layer of each of the memory cells in the first line is formed on the second element isolation region in the first facing region; and part of the third conductive layer of each of the memory cells in the second line is formed on the second element isolation region in the second facing region.

In the semiconductor memory device according to the first and second aspects of the present invention, it is preferable that a pattern of the first and second conductive layers is in a shape of an "h" and a pattern of the third conductive layer is in a shape of a "7". Therefore, the patterns of the first, second, and third conductive layers is the shape of an "h7".

According to the third aspect of the present invention, a method of fabricating a semiconductor memory device having first and second memory cells each of which includes first and second load transistors and first and second driver transistors, wherein:

the method comprises a step of forming first and second element isolation regions, first and second load transistor active regions, and first and second driver transistor active regions on the main surface of a semiconductor substrate, the first element isolation region is positioned between the first and second driver transistors and the first and second load transistors, the second element isolation region is positioned between the first and second load transistors of the first memory cell and the first and second load transistors of the second memory cell, the method of fabricating a semiconductor memory device further comprises:

a step of forming a conductive layer covering the main surface; and a step of forming a first, second, and third conductive layers of the first and second memory cells by patterning the conductive layer, the first conductive layer extends from an area on the first load transistor active region to an area on the first driver transistor active region, the first conductive layer is a gate electrode of the first load transistor and the first driver transistor, the second conductive layer diverges from the first conductive layer on the first element isolation region and extends to an area on the second driver transistor active region, the third conductive layer extends from an area on the second load transistor active region to an area on the second driver transistor active region, the third conductive layer is a gate electrode of the second load transistor and the second driver transistor, a pattern of the first, second, and third conductive layers of the second memory cell is a rotated pattern of the first, second, and third conductive layers in the first memory cell at an angle of 180 degrees around an axis perpendicular to the main surface of the semiconductor substrate, and the method of fabricating a semiconductor memory device still further comprises:

a step of electrically connecting the second conductive layer to the second driver transistor active region, and a step of electrically connecting the third conductive layer to the first load transistor active region.

In the semiconductor memory device according to the third aspect of the present invention, it is preferable that a pattern of the first and second conductive layers is in a shape of an "h" and a pattern of the third conductive layer is in a shape of a "7".

DESCRIPTION OF PREFERRED EMBODIMENT OF THE INVENTION

First Embodiment
(Description of Planar Structure)

Figure 1:
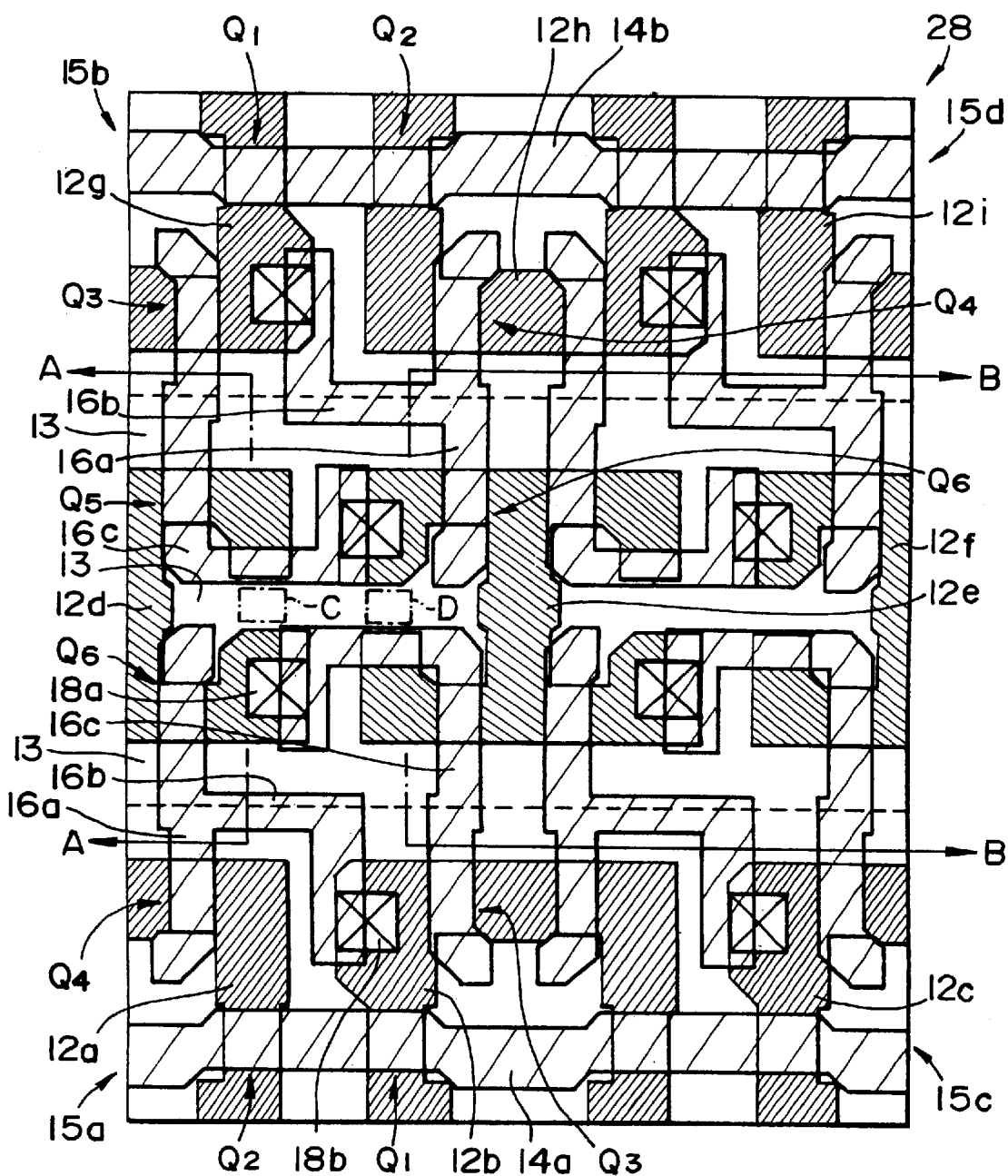
FIG. 1 is a plan view showing a part of an element formation layer of a memory cell array of an SRAM according to a first embodiment of the present invention.
Figure 13:
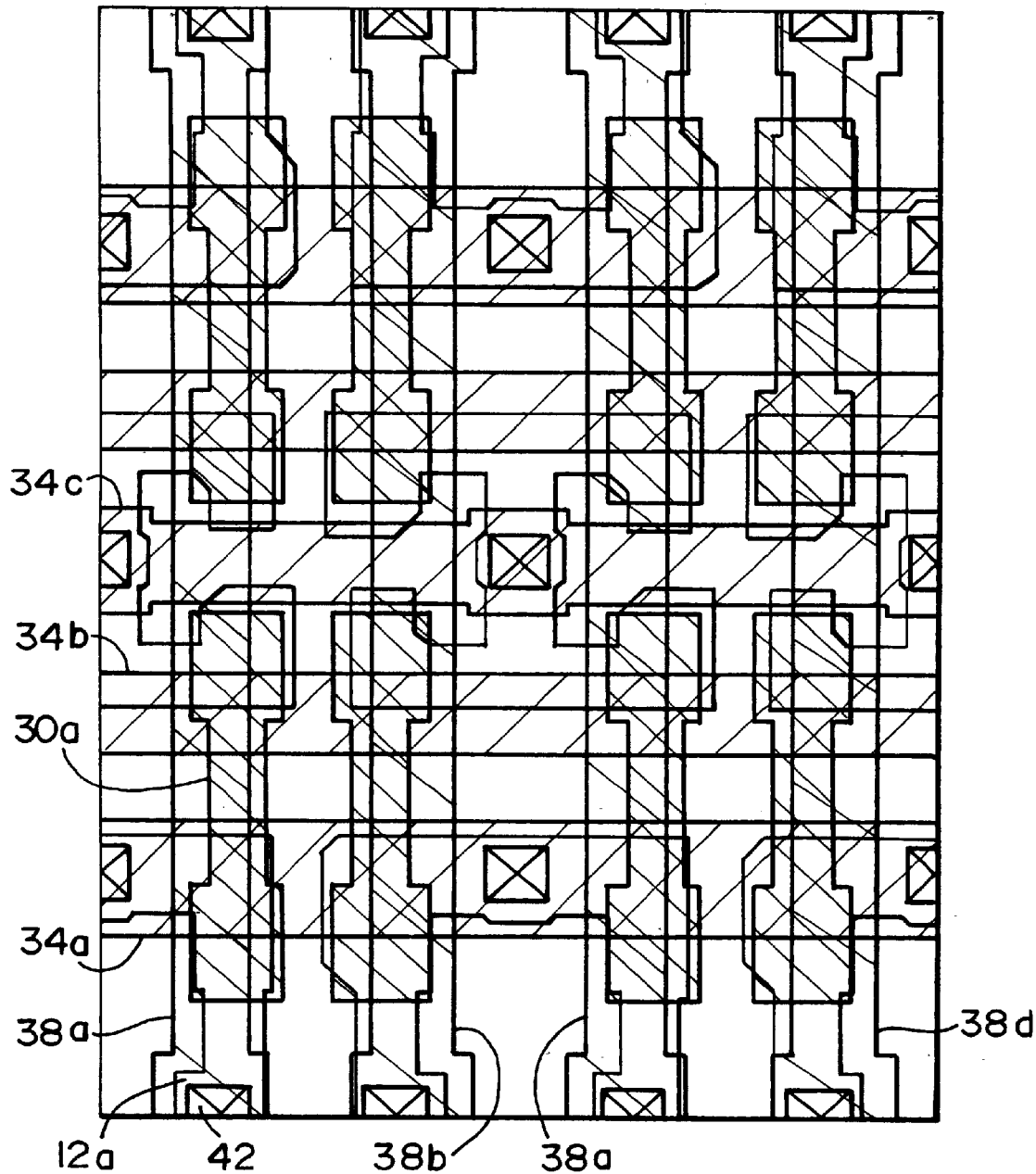
FIG. 13 is a plan view showing part of a wiring layer of a memory cell array of an SRAM according to the first embodiment of the present invention.

FIGS. 1 and 13 are plan views showing part of a memory cell array of an SRAM according to a first embodiment of the present invention. FIG. 1 shows an element formation layer. FIG. 13 shows a wiring layer formed on the element formation layer shown in FIG. 1. The structure shown in FIG. 1 will be described in order from the lowest layer with reference to FIGS. 2 to 7.

Figure 2:
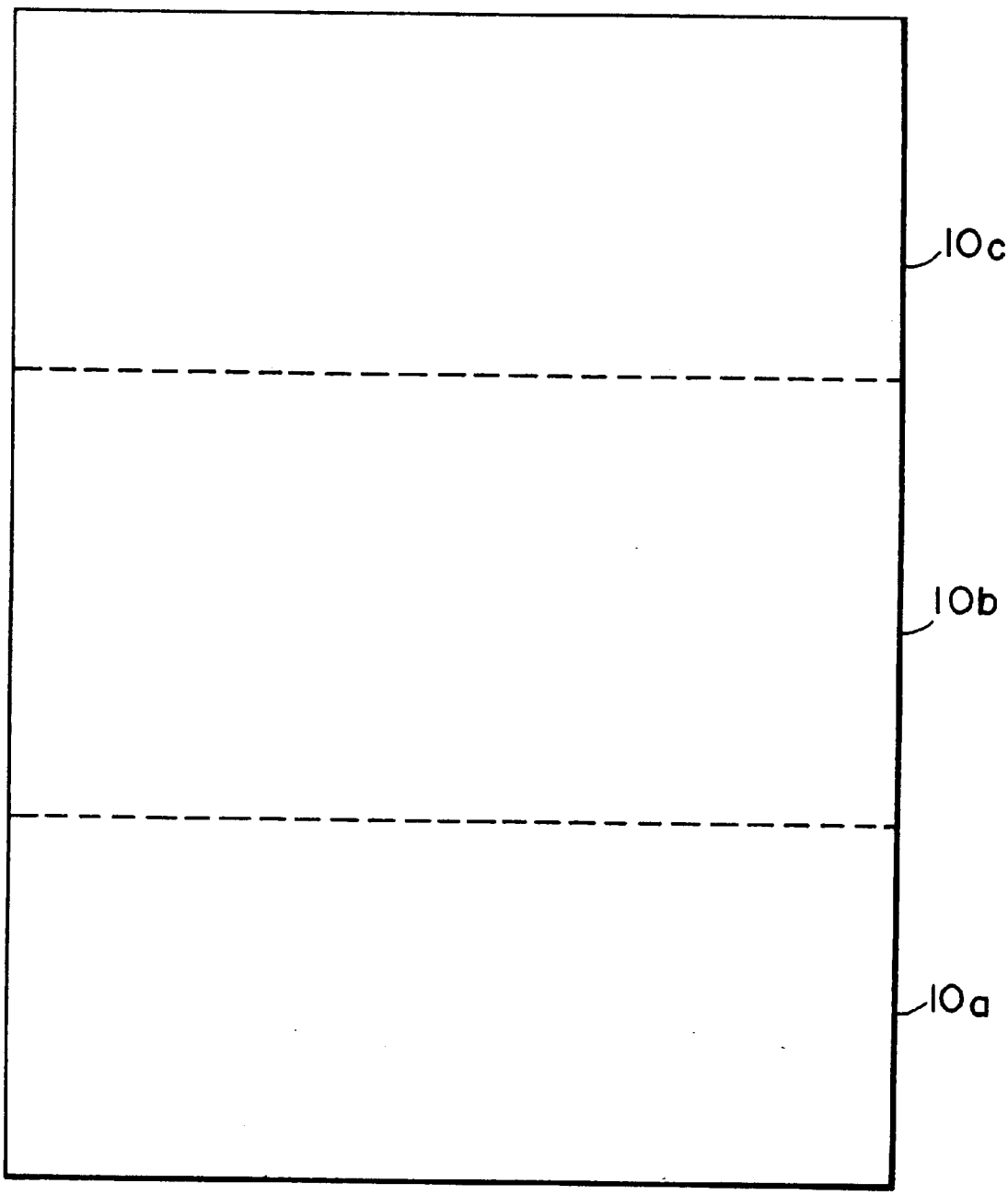
FIG. 2 is a plan view showing a well pattern of an SRAM according to the first embodiment of the present invention.
Figure 3:
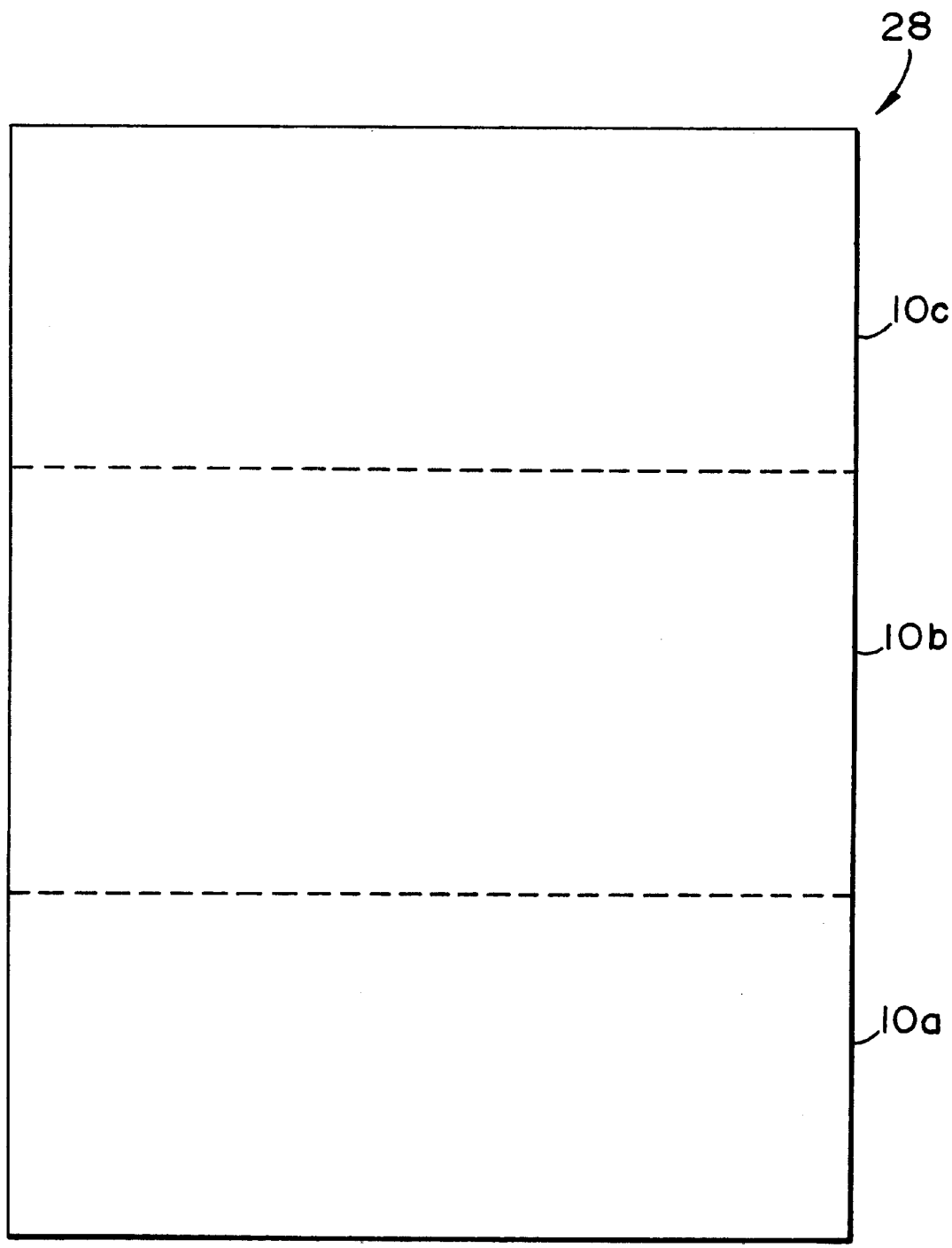
FIG. 3 is a plan view showing a well pattern formed on the main surface of a silicon substrate used for an SRAM according to the first embodiment of the present invention.

FIG. 2 is a plan view showing a pattern of a p-type well $10a$, n-type well $10b$, and p-type well $10c$. FIG. 3 is a plan view showing a pattern of the p-type well $10a$, n-type well $10b$, and p-type well $10c$ formed on the main surface of a silicon substrate 28, which is an example of a semiconductor substrate.

Figure 4:
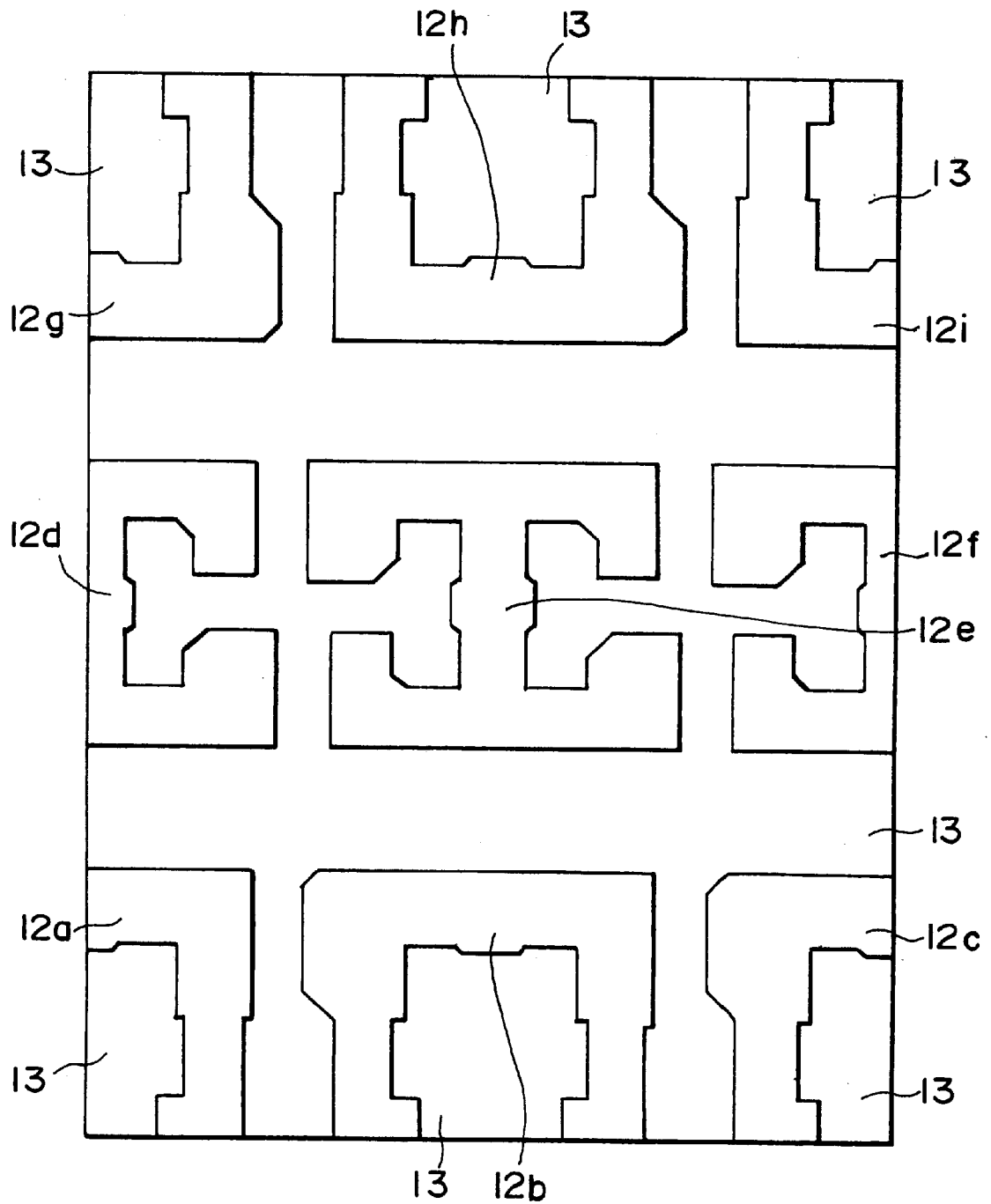
FIG. 4 is a plan view showing a pattern of an active region and a field oxide region of an SRAM according to the first embodiment of the present invention.
Figure 5:
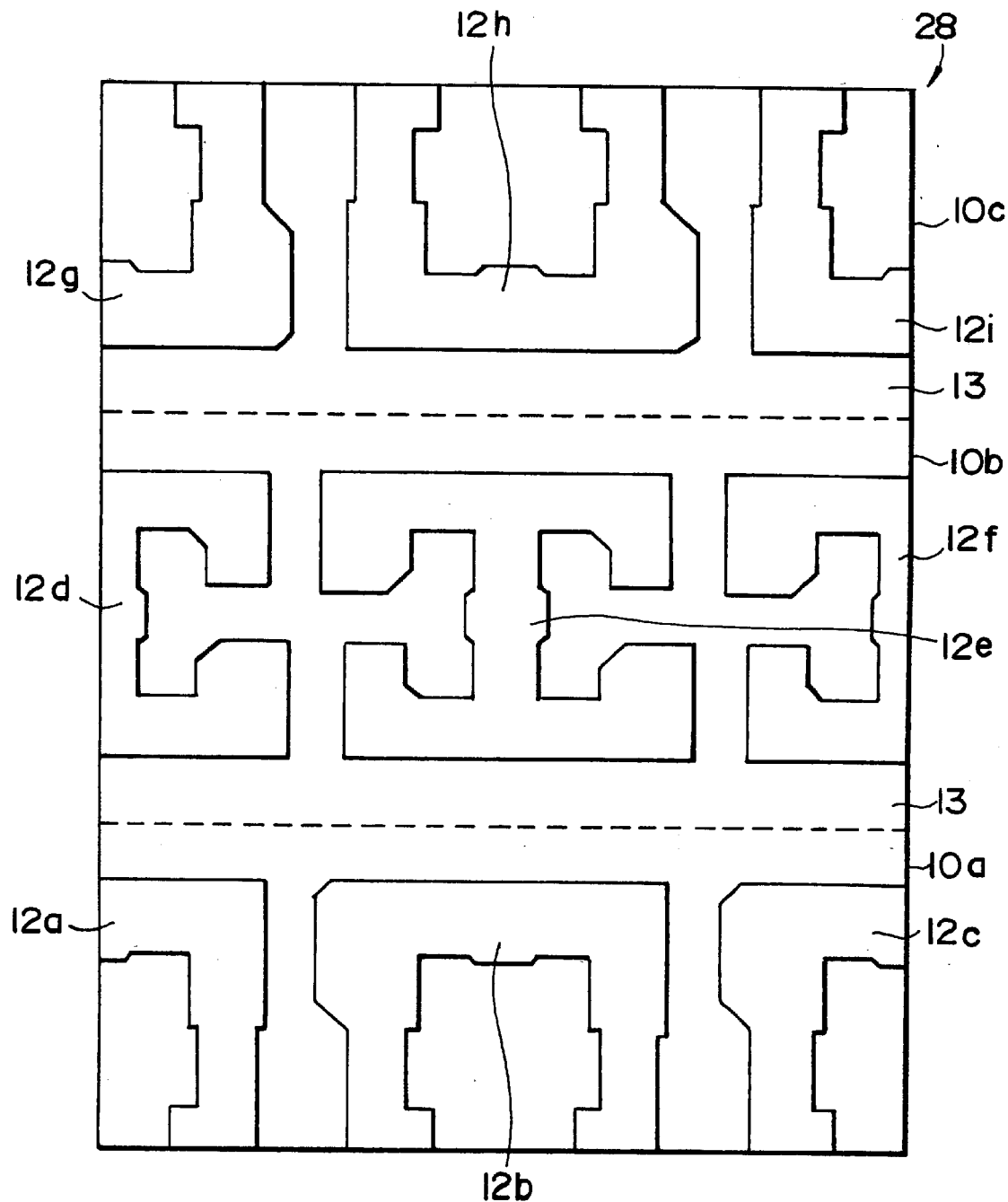
FIG. 5 is a plan view showing a pattern of an active region and a field oxide region formed on the main surface of a silicon substrate used for an SRAM according to the first embodiment of the present invention.

FIG. 4 is a plan view showing a pattern of active regions $12a$ to $12i$ and a field oxide region 13. Each active region $12a$ to $12i$ is isolated from each other by the field oxide region 13. FIG. 5 is a plan view showing the pattern shown in FIG. 4 formed on the main surface of the silicon substrate shown in FIG. 3.

Figure 6:
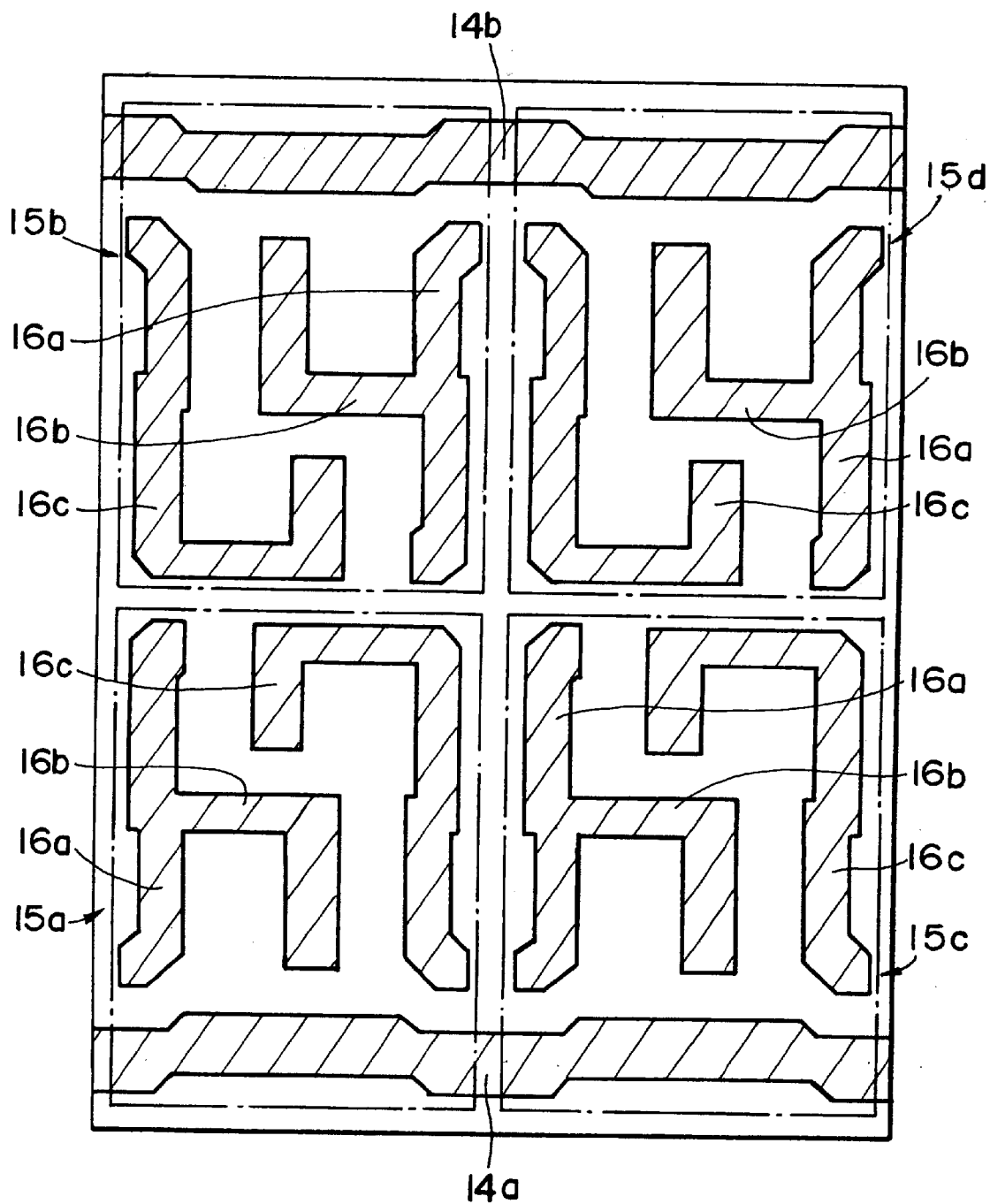
FIG. 6 is a plan view showing word lines and a pattern of first, second, and third conductive layers in a memory cell formation region of an SRAM according to the first embodiment of the present invention.

FIG. 6 is a plan view showing word lines $14a$ and $14b$ and a pattern of a first conductive layer $16a$, second conductive layer $16b$, and third conductive layer $16c$ in each of four memory cell formation regions $15a$ to $15d$. The word lines $14a$ and $14b$, the first conductive layer $16a$, second conductive layer $16b$, and third conductive layer $16c$ are formed from polysilicon and the like. The first conductive layer $16a$ and the second conductive layer $16b$ are in the shape of an "h" in combination and the third conductive layer $16c$ is in the shape of a "7".

The pattern of the first conductive layer $16a$, second conductive layer $16b$, and third conductive layer $16c$ in memory cell formation regions $15b$ and $15d$ is a pattern of the first conductive layer $16a$, second conductive layer $16b$, and third conductive layer $16c$ in memory cell formation regions $15a$ and $15c$ rotated 180 degrees around an axis perpendicular to the surface with the pattern formed thereon (the main surface of the semiconductor substrate).

Figure 7:
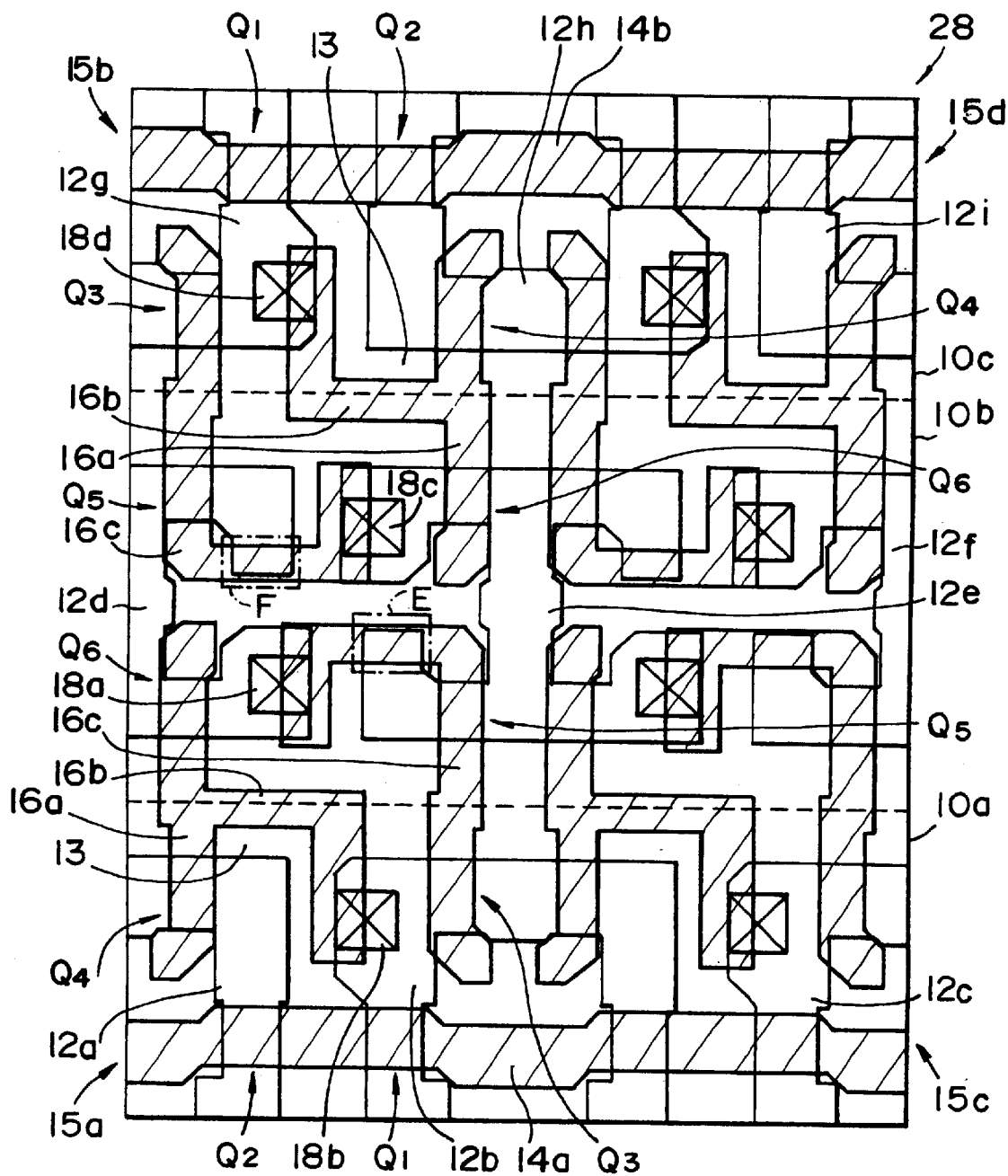
FIG. 7 is a plan view showing word lines and a pattern of first, second, and third conductive layers in a memory cell forming region formed on the main surface of a silicon substrate used for an SRAM according to the first embodiment of the present invention.

FIG. 7 is a plan view showing the pattern shown in FIG. 6 formed on the main surface of the silicon substrate 28 shown in FIG. 5. The memory cell formation regions $15a$ and $15c$ are part of the first line of the memory cell array. The memory cell formation regions $15b$ and $15d$ are part of the second line of the memory cell array. Configurations of the first conductive layer, second conductive layer, third conductive layer, and word lines to the active region of the memory cell in the first line will be described with respect to the memory cell formation region $15a$. The first conductive layer $16a$ extends from an area on the active region $12d$ to an area on the active region $12a$ to be a gate electrode for a load transistor $Q_6$ and a driver transistor $Q_4$.

The second conductive layer $16b$ diverges from the first conductive layer $16a$ on the field oxide region 13 and is electrically connected to the active region $12b$ at a contact portion $18b$.

The third conductive layer $16c$ is electrically connected to the active region $12d$ at a contact portion $18a$ and extends to an area on the active region $12b$ across an area on the active region $12e$ in a line. The third conductive layer $16c$ is a gate electrode for a load transistor $Q_5$ and a driver transistor $Q_3$.

A region indicated by E shows a first facing region that is a region in the second load transistor active region of the first memory cell, and faces the first load transistor active region of the second memory cell with the second element isolation region interposing therebetween. The pattern of the third conductive layer $16c$ is formed across an area on the first facing region.

The word line $14a$ extends from an area on the active region $12a$ to an area on the active region $12b$ to be a gate electrode for transfer transistors $Q_2$ and $Q_1$.

Configurations of the first conductive layer, second conductive layer, third conductive layer, and word lines with respect to the active region of the memory cell in the second line will be described with respect to the memory cell formation region 15b. The first conductive layer 16a extends from an area on the active region 12e to an area on the active region 12h to be a gate electrode of the load transistor $Q_6$ and the driver transistor $Q_4$.

The second conductive layer 16b diverges from the first conductive layer 16a on the field oxide region 13 and electrically connected to the active region 12g at a contact portion 18d.

The third conductive layer 16c is electrically connected to the active region 12e at a contact portion 18c and extends to an area on the active region 12g across an area on the active region 12d in a line. The third conductive layer 16c is a gate electrode for the load transistor $Q_5$ and the driver transistor $Q_3$.

A region indicated by F shows the second facing region that is a region in the second load transistor active region of the second memory cell, and faces the first load transistor active region of the first memory cell with the second element isolation region interposing therebetween. The pattern of the third conductive layer 16c is formed across an area on the second facing region.

The word line 14b extends from an area on the active region 12h to an area on the active region 12g to be a gate electrode for the transfer transistors $Q_2$ and $Q_1$.

The first conductive layer, second conductive layer, third conductive layer, word lines, and contact portions are formed as follows. After the formation of the structure shown in FIG. 5, a conductive layer of polysilicon and the like is formed to cover the main surface of the silicon substrate. This conductive layer is patterned to form the first conductive layer, second conductive layer, third conductive layer, and word lines. Source regions and drain regions are formed by ion implantation in the main surface of the silicon substrate using the first conductive layer, second conductive layer, third conductive layer, and word lines as masks. An insulating layer such as a silicon oxide layer covering the main surface of the silicon substrate is formed. Contact holes for electrically connecting the second conductive layer to the second driver transistor active region and for electrically connecting the third conductive layer to the first load transistor active region are formed in the insulating layer. The contact holes are filled with conductive layers to form the contact portions.

Next, FIG. 1 is described below. FIG. 1 is a plan view showing the source regions and the drain regions formed in the active regions 12a to 12i on the main surface of the silicon substrate 28 shown in FIG. 7 using the word lines 14a and 14b, the first conductive layer 16a, second conductive layer 16b, and third conductive layer 16c as masks. The source regions and the drain regions are shown by the shaded areas in the active regions 12a to 12i. The source regions and the drain regions in the active regions 12a to 12c and 12g to 12i are n-type, and the source regions and the drain regions in the active regions 12d to 12f are p-type.

The structure shown in FIG. 1 is as described above. The structure shown in FIG. 13 will be described in order from the lowest layer with reference to FIGS. 8 to 12.

Figure 8:
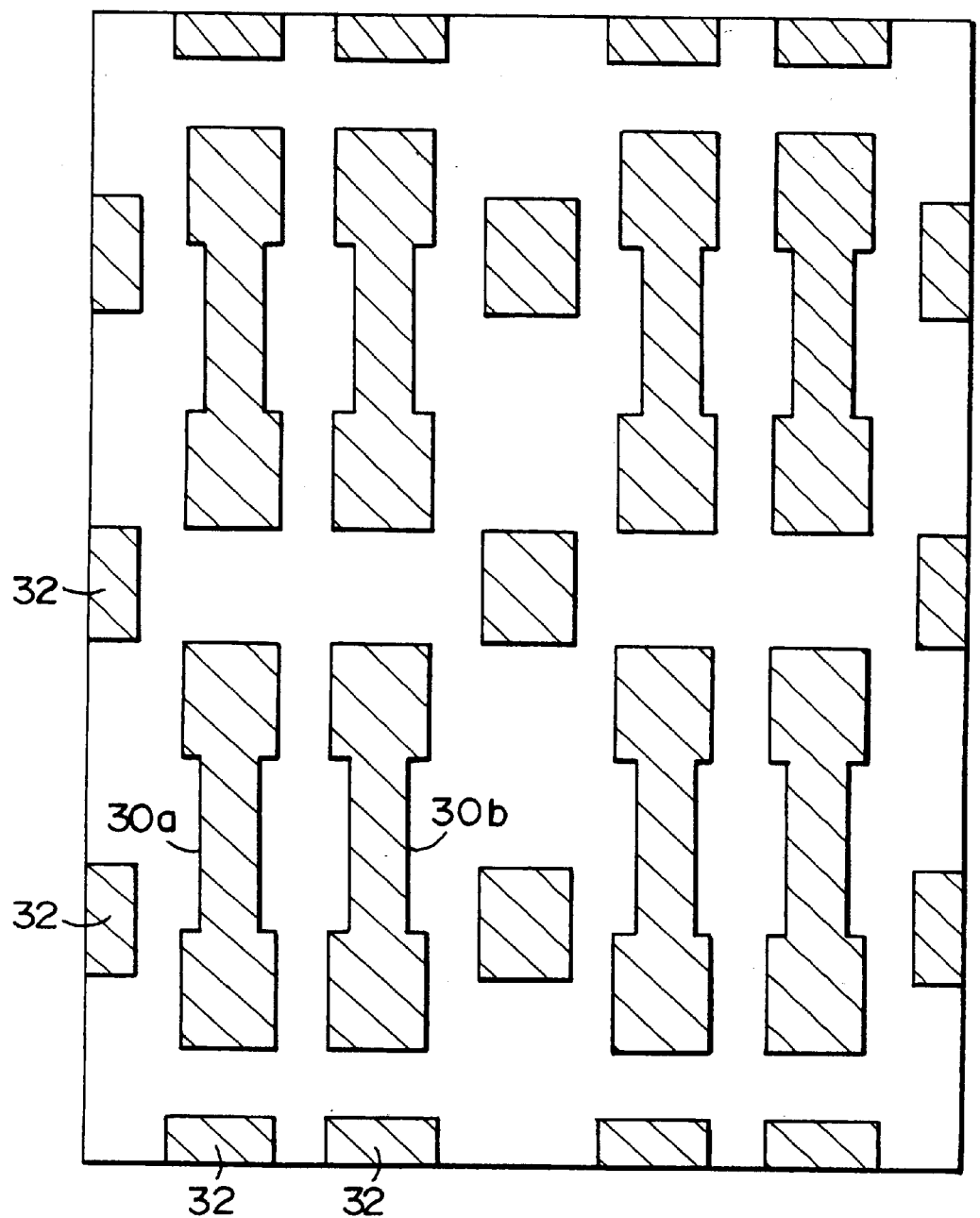
FIG. 8 is a plan view showing a drain contact layer and a pattern of a contact layer of an SRAM according to the first embodiment of the present invention.
Figure 9:
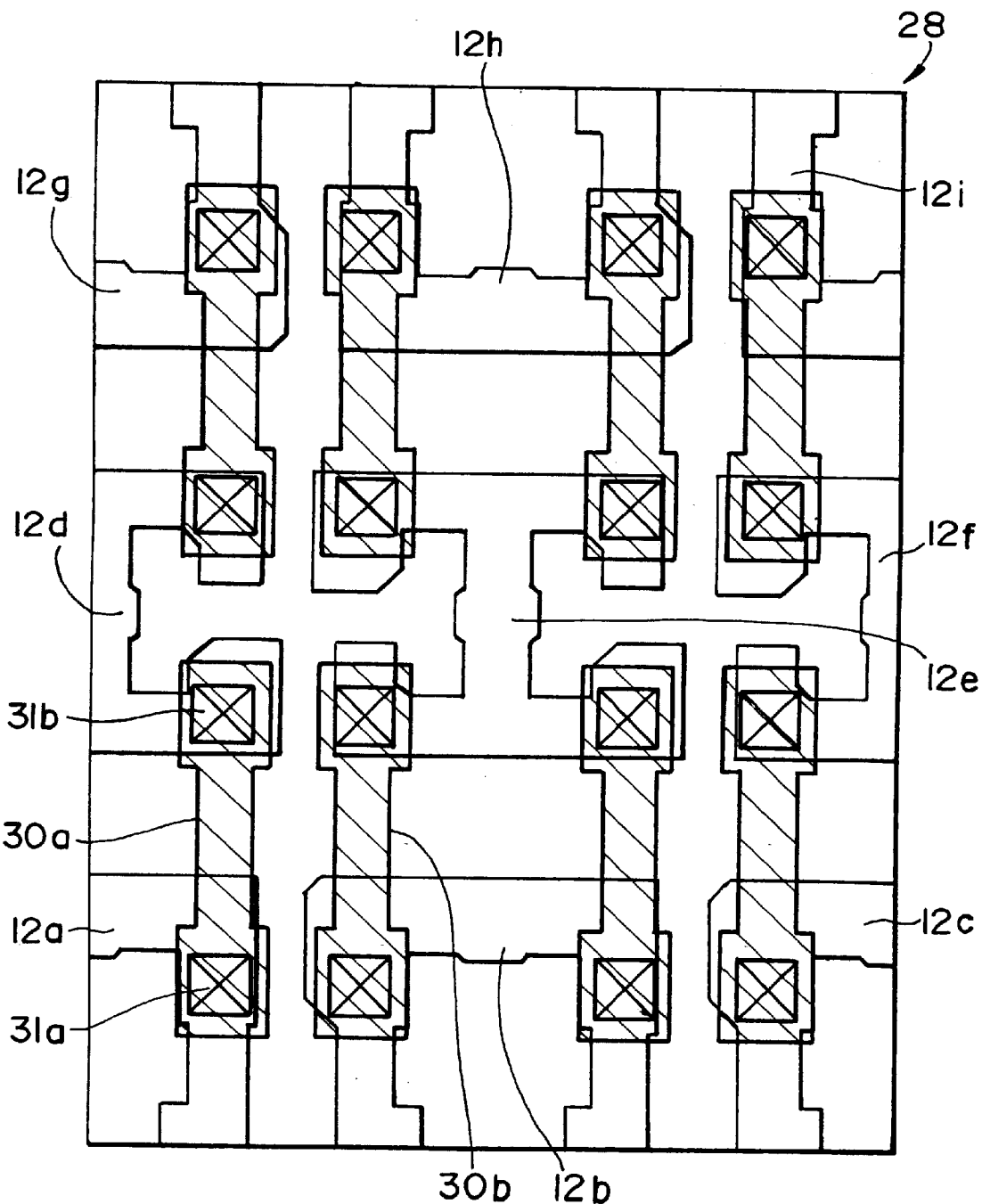
FIG. 9 is a plan view showing a pattern of a drain contact layer formed on the main surface of a silicon substrate used for an SRAM according to the first embodiment of the present invention.

FIG. 8 is a plan view showing a pattern of drain contact layers 30a and 30b and a contact layer 32. FIG. 9 is a plan view showing the pattern shown in FIG. 8 formed on the main surface of the silicon substrate 28 shown in FIG. 1. In FIG. 9, structural units shown in FIG. 1 other than the active regions 12a to 12i are omitted. The slanted lines showing the source regions and the drain regions in the active regions 12a to 12i are omitted. The contact layers 32 shown in FIG. 8 are omitted.

In FIG. 9, the drain contact layers are electrically connected to the drain regions in the active regions. For example, the drain contact layer 30a is electrically connected to the drain region in the active region 12a at a contact portion 31a, and to the drain region in the active region 12d at a contact portion 31b.

Figure 10:
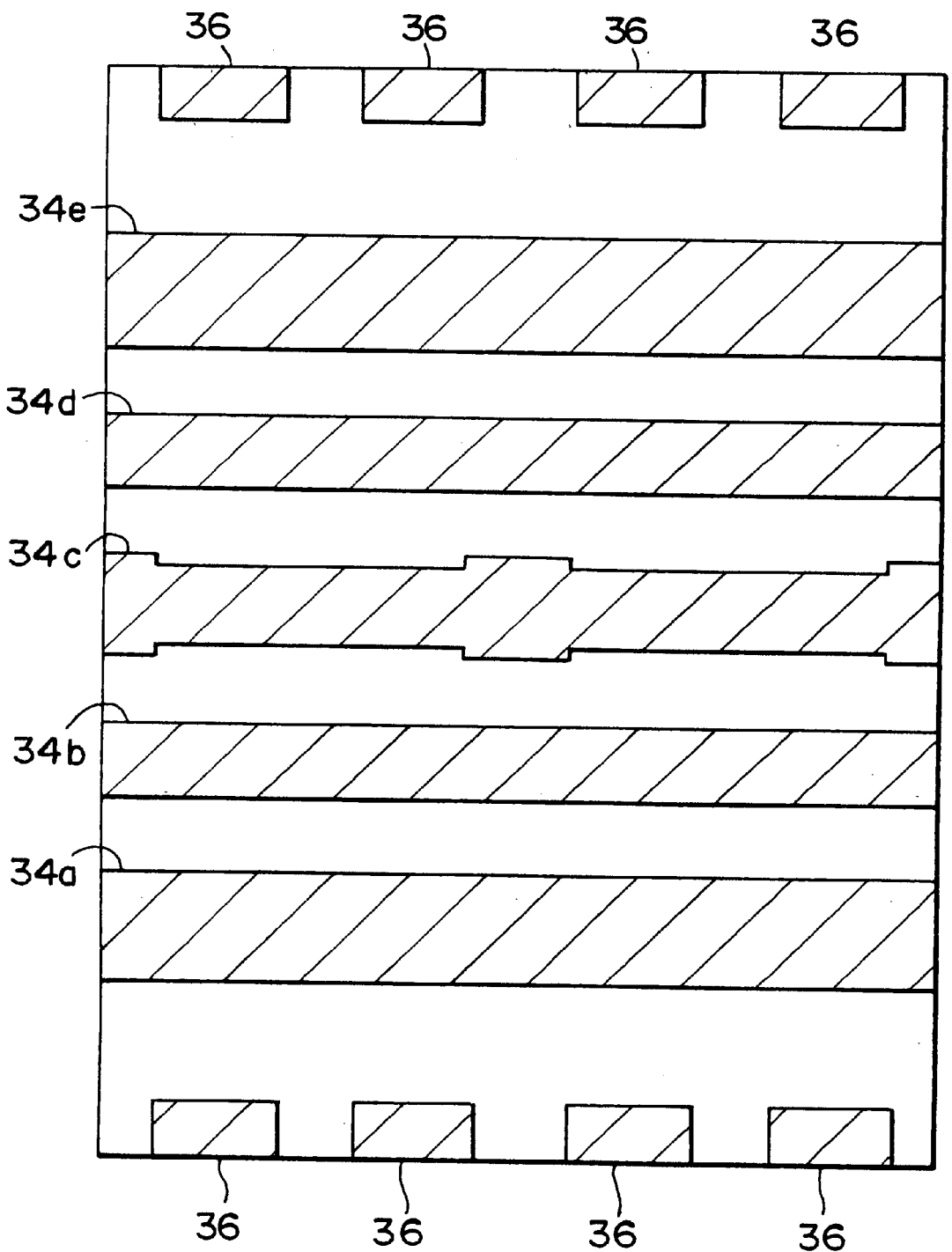
FIG. 10 is a plan view showing a wiring layer and a pattern of a contact layer of an SRAM according to the first embodiment of the present invention.
Figure 11:
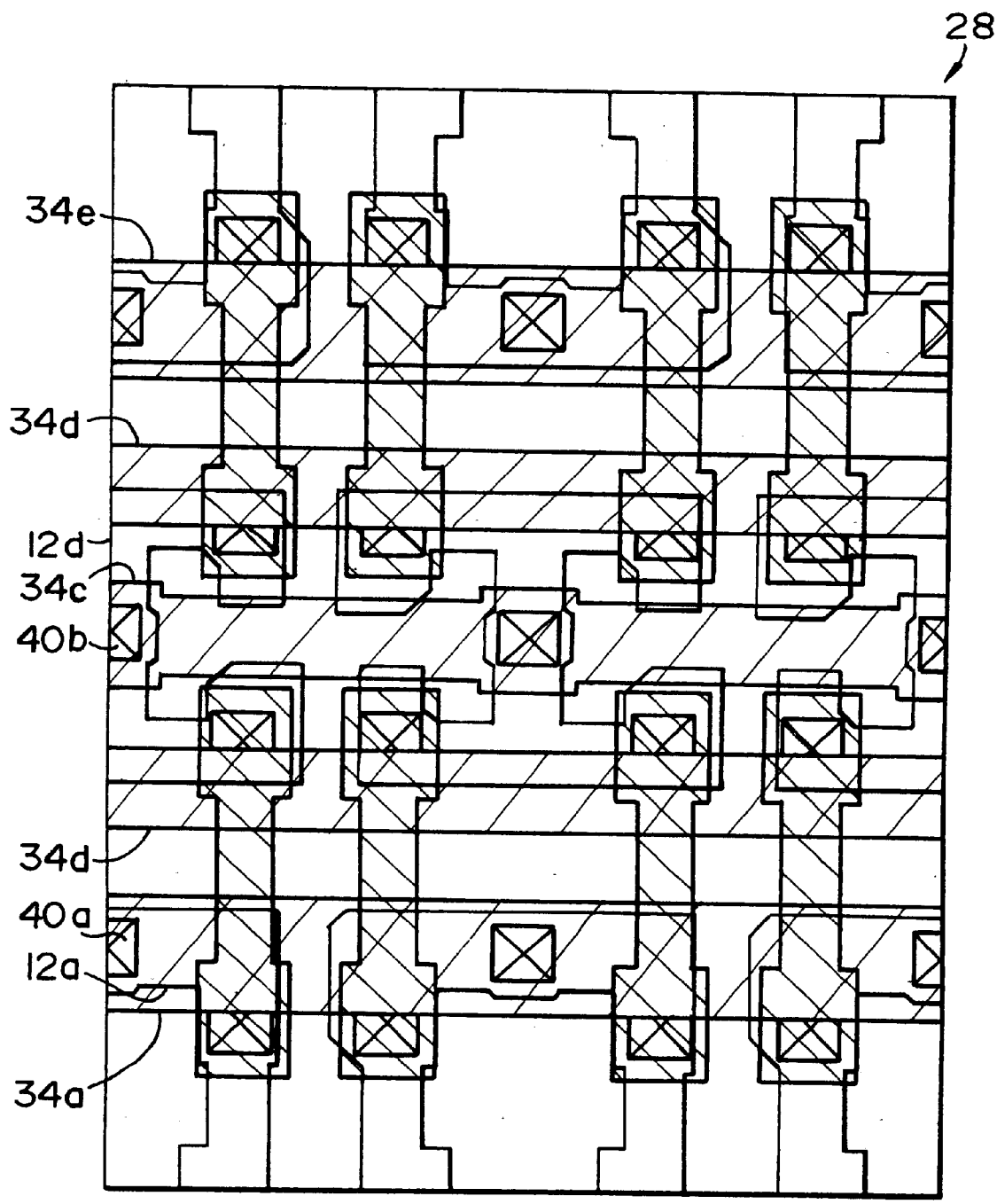
FIG. 11 is a plan view showing a pattern of a wiring layer formed on the main surface of a silicon substrate used for an SRAM according to the first embodiment of the present invention.

FIG. 10 is a plan view showing a pattern of wiring layers 34a to 34e and contact layers 36. These wiring layers 34a to 34e and contact layers 36 are made of aluminum or aluminum alloys comprising aluminum and copper and the like. FIG. 11 is a plan view showing the pattern shown in FIG. 10 formed on the main surface of the silicon substrate 28 shown in FIG. 9. In FIG. 11, the contact layers 36 shown in FIG. 10 are omitted.

The wiring layers 34a to 34e are electrically connected to the source regions in the active regions. For example, the wiring layer 34a is electrically connected to the source region in the active region 12a at a contact portion 40a through the contact layer 32 and a contact portion provided under the contact layer 32 (not shown). The wiring layer 34a is electrically connected to a ground $V_{SS}$. The wiring layer 34c is electrically connected to the source region in the active region 12d at a contact portion 40b. The wiring layer 34c is electrically connected to a power supply $V_{DD}$.

Figure 12:
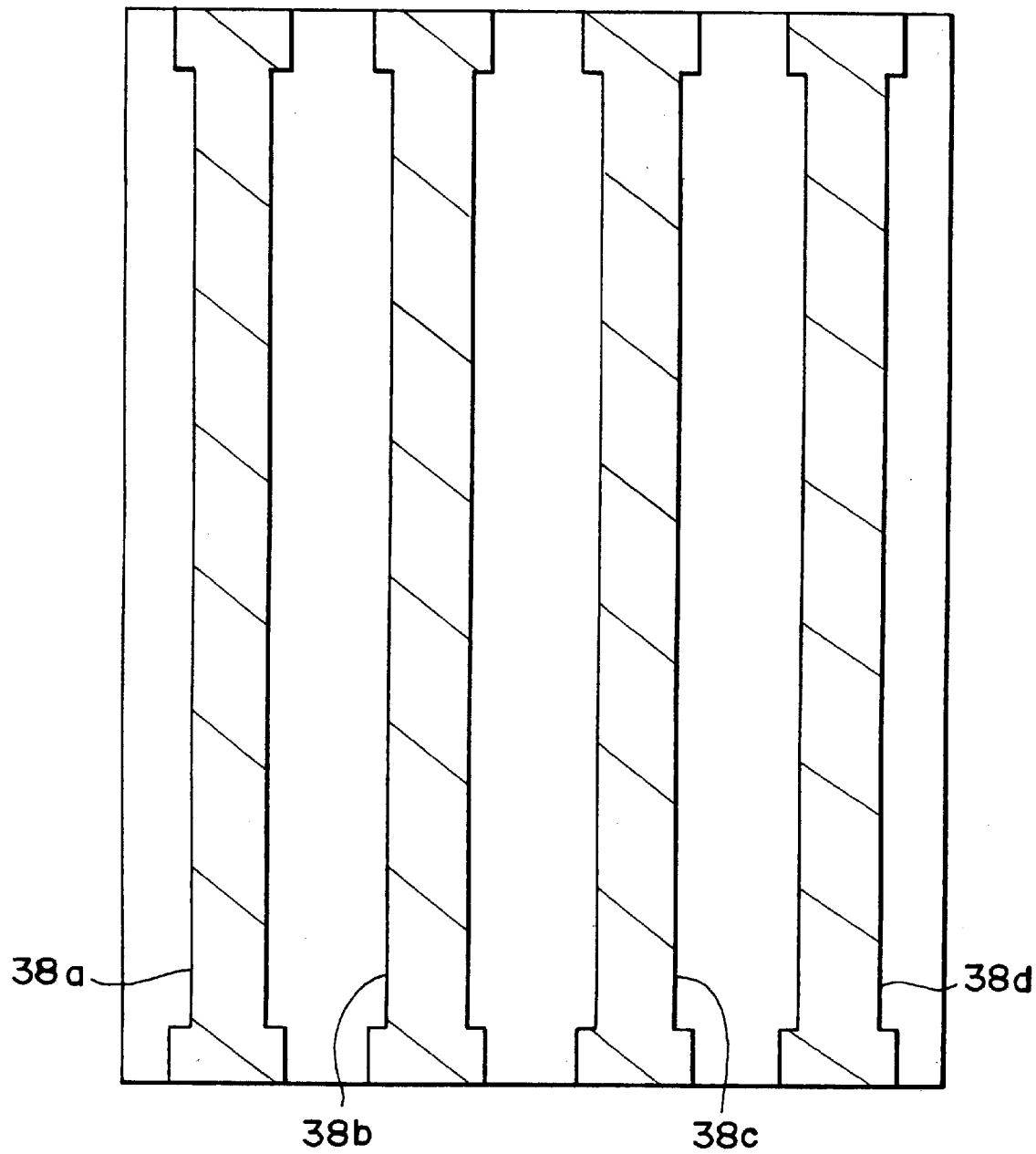
FIG. 12 is a plan view showing a pattern of bit lines of an SRAM according to the first embodiment of the present invention.

FIG. 12 is a plan view showing a pattern of bit lines 38a to 38d. The bit lines 38a to 38d are made of aluminum or an aluminum alloy comprising aluminum and copper and the like.

FIG. 13 is a plan view showing the pattern shown in FIG. 12 formed on the main surface of the silicon substrate 28 shown in FIG. 11. The bit lines 38a to 38d are electrically connected to the active regions. For example, the bit line 38a is electrically connected to the active region 12a at a contact portion 42 through the contact layer 36, a contact portion provided under the contact layer 36 (not shown), the contact layer 32, and a contact portion provided under the contact layer 32 (not shown).

(Description of Equivalent Circuit)

Figure 14:
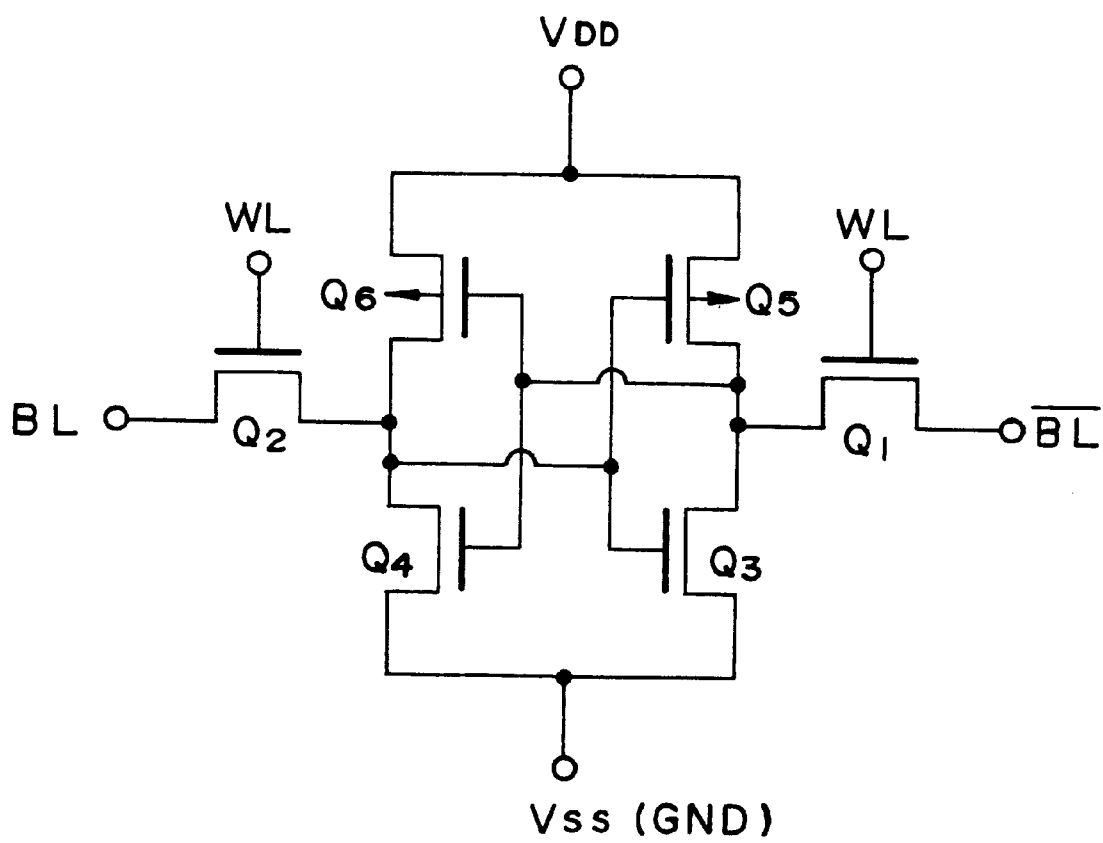
FIG. 14 shows an equivalent circuit of an SRAM according to the first embodiment of the present invention.

FIG. 14 shows an equivalent circuit of the memory cell of the SRAM shown in FIGS. 1 and 13. The load transistor $Q_5$ and the driver transistor $Q_3$ constitute an inverter, and the load transistor $Q_6$ and the driver transistor $Q_4$ constitute the other inverter. These inverters are electrically connected to form a flip-flop.

The source/drain of the transfer transistor $Q_2$ is electrically connected to the inverter, comprising the load transistor $Q_6$ and the driver transistor $Q_4$, and to the bit line. The gate electrode of the transfer transistor $Q_2$ is electrically connected to the word line.

The sources of the load transistors $Q_5$ and $Q_6$ are electrically connected to the power supply $V_{DD}$. The sources of the driver transistors $Q_3$ and $Q_4$ are electrically connected to the ground $V_{SS}$.

The source/drain of the transfer transistor $Q_1$ is electrically connected to the inverter, comprising the load transistor $Q_5$ and the driver transistor $Q_3$, and to the bit line. The gate electrode of the transfer transistor $Q_1$ is electrically connected to the word line.

(Description of Cross-sectional Structure)

Figure 15:
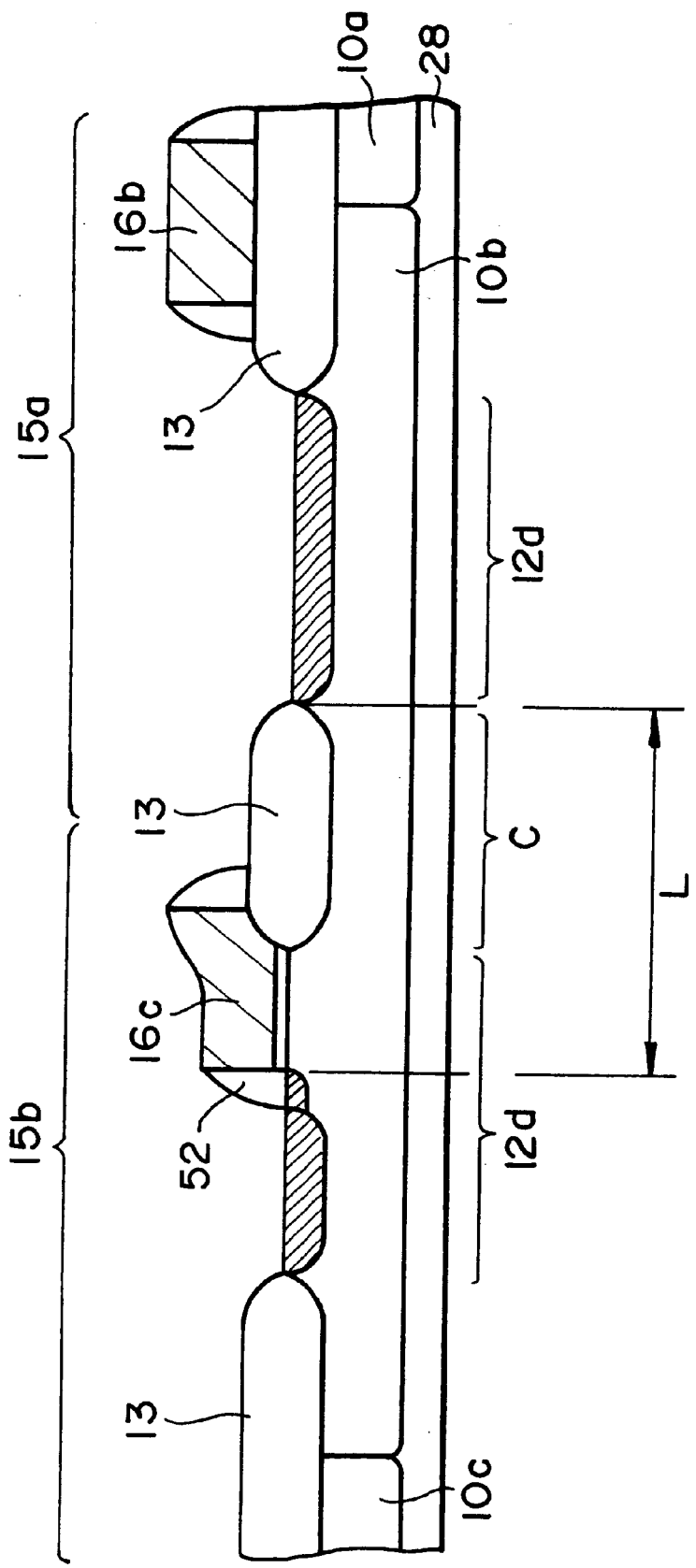
FIG. 15 is a cross sectional view of the memory cell of the SRAM shown in FIG. 1 along the A—A line.
Figure 16:
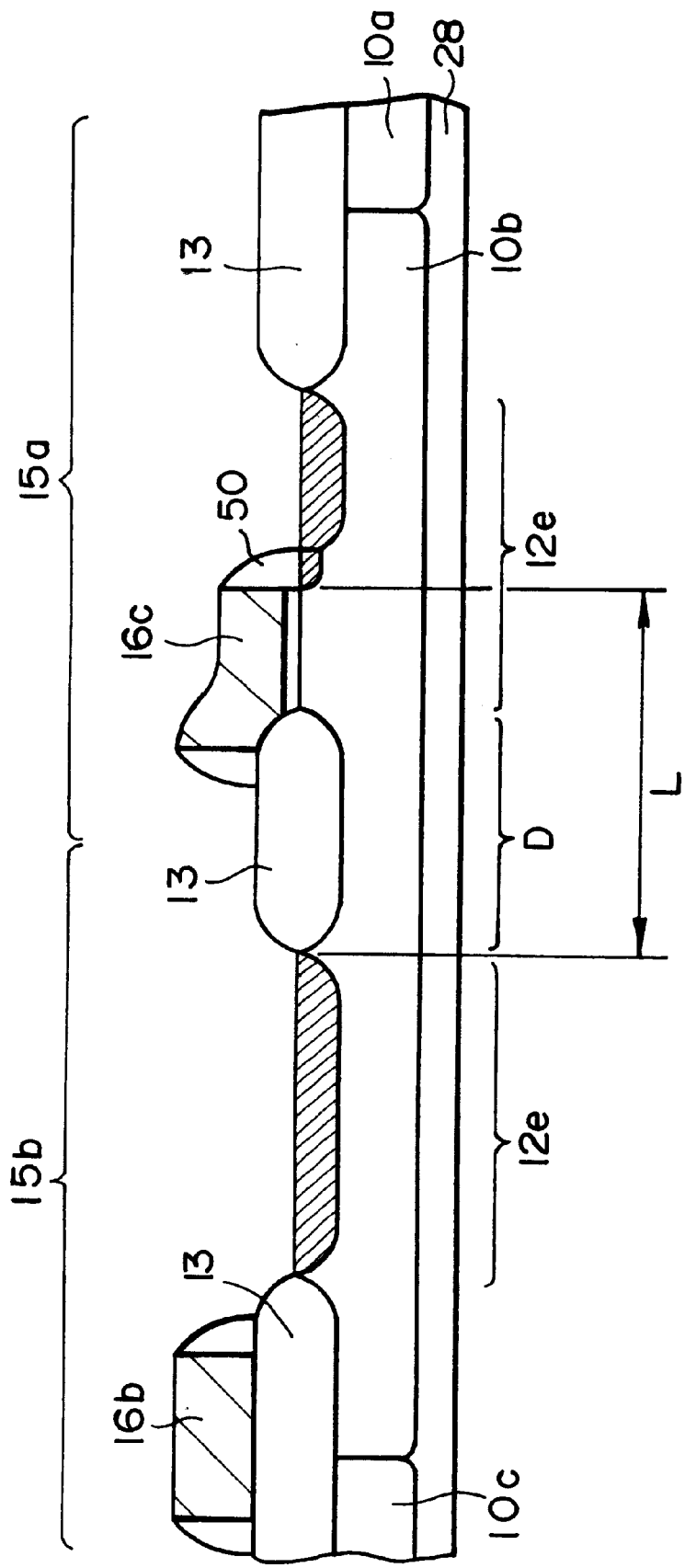
FIG. 16 is a cross sectional view of the memory cell of the SRAM shown in FIG. 1 along the B—B line.

FIG. 15 is a cross sectional view of the memory cell of the SRAM shown in FIG. 1 along the A—A line. FIG. 16 is a cross sectional view of the memory cell of the SRAM shown in FIG. 1 along the B—B line.

In FIGS. 15 and 16, the p-type well 10a, n-type well 10b, and p-type well 10c are formed on the main surface of the silicon substrate 28. The active regions 12d and 12e are formed on the n-type well 10b. The active regions 12d and 12e are divided in two regions by the field oxide region 13.

In FIG. 15, the third conductive layer 16c is formed in an area on the active region 12d, and part of the third conductive layer 16c is positioned on the field oxide region 13. A side wall oxide film 52 is formed on the side of the third conductive layer 16c. The side wall oxide film 52 is positioned in an area on the second facing region (active region 12d). The second conductive layer 16b is formed on the field oxide region 13 extending over the p-type well 10a and the n-type well 10b.

In FIG. 16, the third conductive layer 16c is formed in an area on the active region 12e, and part of the third conductive layer 16c is positioned on the field oxide region 13. A side wall oxide film 50 is formed on the side of the third conductive layer 16c. The side wall oxide film 50 is positioned in an area on the first facing region (active region 12e). The second conductive layer 16b is formed on the field oxide region 13 extending over the p-type well 10c and the n-type well 10b.

(Description of Effect)
(Effect 1)

In FIG. 1, the pattern of the first conductive layer 16a, second conductive layer 16b, and third conductive layer 16c in memory cell formation regions 15b and 15d is a pattern of the first conductive layer 16a, second conductive layer 16b, and third conductive layer 16c in memory cell formation regions 15a and 15c rotated 180 degrees around an axis perpendicular to the main surface of the semiconductor substrate 28. Because of this structure, the punch-through can be prevented in regions shown by C and D below the field oxide region 13.

Specifically, the active region 12d in the memory cell formation region 15b faces the active region 12d in the memory cell formation region 15a, with the region C interposing in between. The pattern of the third conductive layer 16c in the memory cell formation region 15b crosses over the second facing region (region F in FIG. 7). Because of this, as shown in FIG. 15, a distance L is extended for the width of the third conductive layer 16c and the field oxide region 13 which are formed between a region to be a drain of the memory cell formation region 15b (shaded region) and a region to be a drain of the memory cell formation region 15a (shaded region). This advantage is also applied to the region D in FIGS. 1 and 16. Therefore, punch-through can be prevented in the regions C and D below the field oxide region 13.

(Effect 2)

Figure 17:
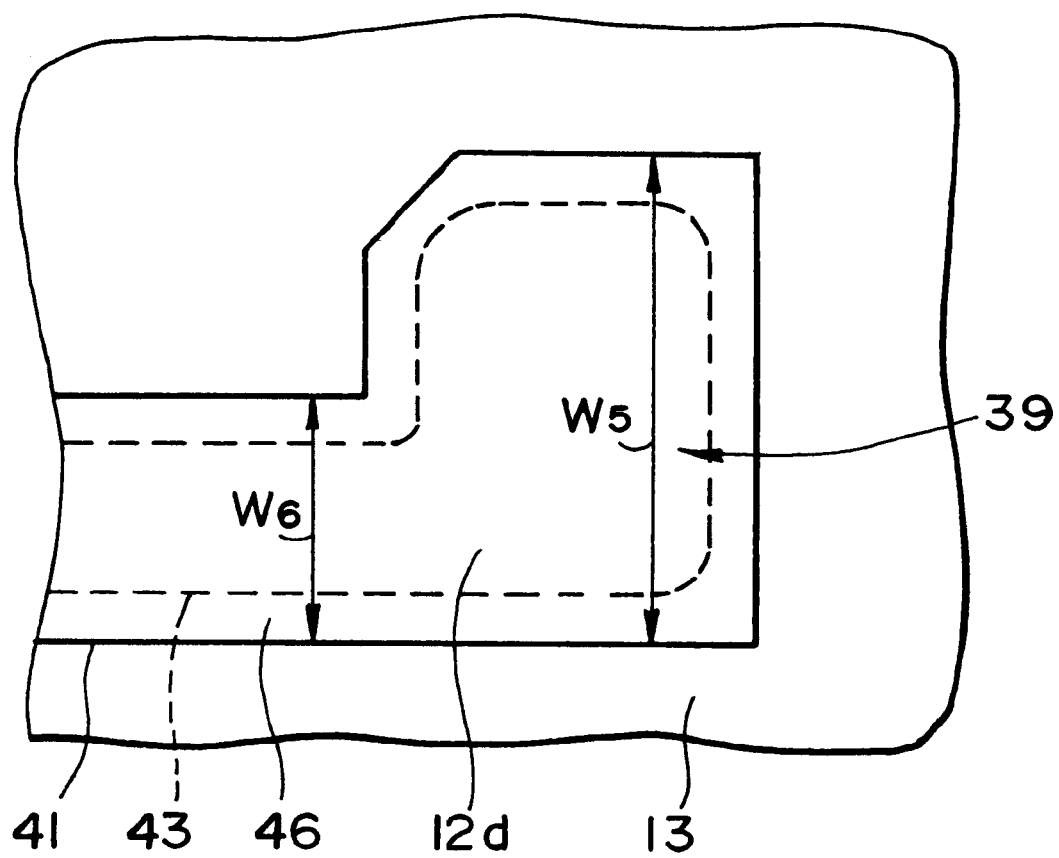
FIG. 17 is a plan view showing an end portion of the active region shown in FIG. 1.

FIG. 17 is a plan view showing an end portion 39 of the active region 12d shown in FIG. 1. At the end portion 39, the drain contact layer 30a shown in FIG. 8 and the conductive layer 16c shown in FIG. 1 are electrically connected.

In the design, the active region 12d is indicated by a solid line 41. Actually, the active region 12d is indicated by a dotted line 43 due to a bird's beak 46.

In the first embodiment, the width $W_5$ of the end portion 39 is designed to be wider than the width $W_6$ of the other sections. Because the end portion 39 has a larger area, the end portion 39 can be connected to the drain contact layer 30a and the third conductive layer 16c even if the bird's beak 46 is formed.

Second Embodiment
(Description of Structure)

Figure 18:
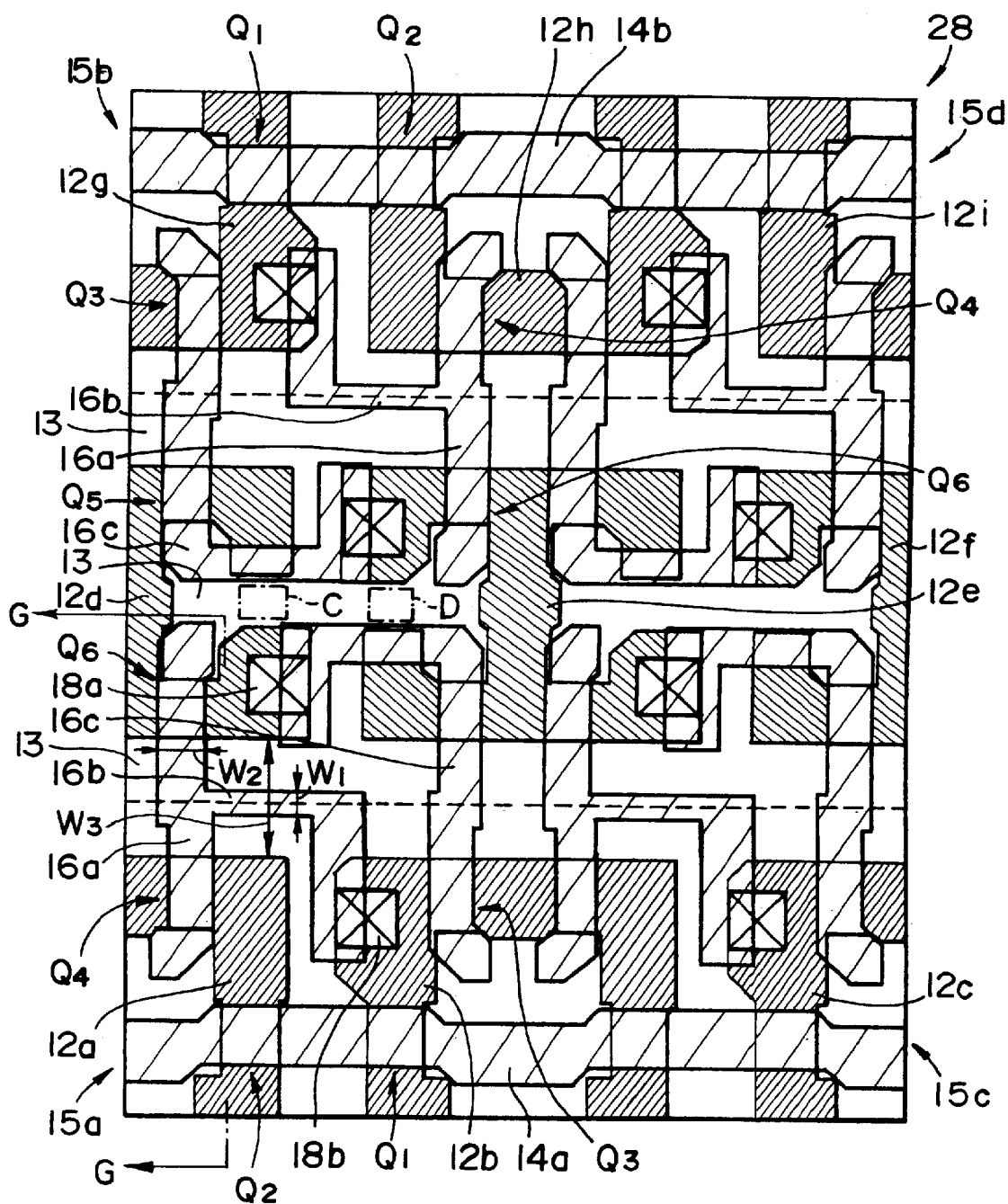
FIG. 18 is a plan view showing a part of an element formation layer of a memory cell array of an SRAM according to a second embodiment of the present invention.
Figure 19:
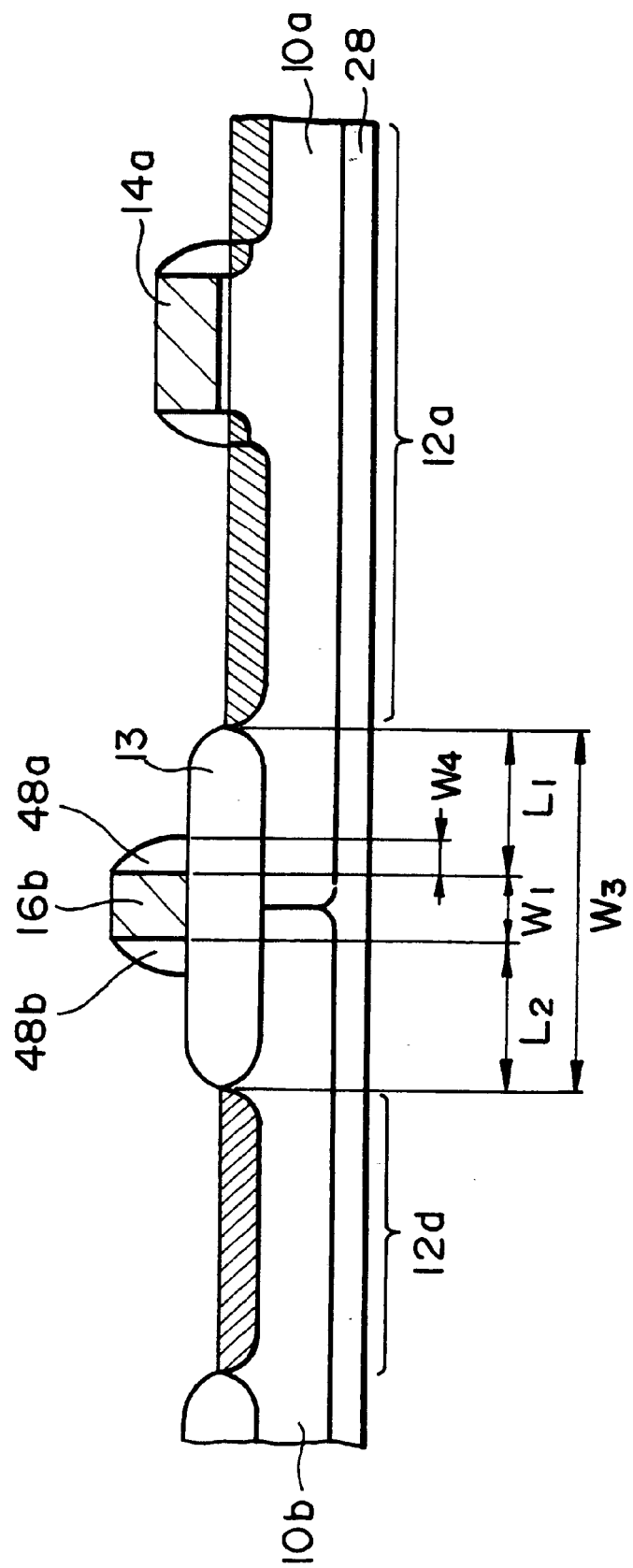
FIG. 19 is a cross sectional view of the memory cell of the SRAM shown in FIG. 18 along the G—G line.

FIG. 18 is a plan view showing part of an element formation layer of a memory cell array of an SRAM according to the second embodiment of the present invention. FIG. 19 is a cross sectional view of the memory cell of the SRAM shown in FIG. 18 along the G—G line. The second embodiment differs from the first embodiment in terms of the width of the second conductive layer 16b. Specifically, in the second embodiment, the width $W_1$ of the second conductive layer 16b formed on the field oxide region 13 is smaller than the width $W_2$ of the first conductive layer 16a. Since the structure other the width of the second conductive layer 16b is the same as that in the first embodiment, further description is omitted by using the same reference numerals.

(Description of Effect)
(Effect 1)

As shown in FIG. 18, the width $W_1$ of the second conductive layer 16b formed on the field oxide region 13 is smaller than the width $W_2$ of the first conductive layer 16a in the second embodiment. Therefore, the width $W_1$ of the second conductive layer 16b formed on the field oxide region 13 can be reduced. Because of this, the width $W_3$ of the field oxide region 13 can be reduced without causing an imbalance in the β ratio of the memory cell while taking into account the mask alignment deviations when forming the first conductive layer, second conductive layer, and third conductive layer. As described above, according to the second embodiment, the memory cell size can be reduced without causing an imbalance in the β ratio of the memory cell.

(Effect 2)

As shown in FIG. 19, in the second embodiment, a distance $L_1$ between the second conductive layer 16b formed on the field oxide region 13 and the active region 12a is larger than the sum of an alignment error value Ae at the time of forming the patterns of the first, second, and third conductive layers and the width $W_4$ of the side wall insulating layer 48a. For example, $L_1$, Ae, and $W_4$ are 0.25 μm, 0.1 μm, and 0.1 μm, respectively.

This prevents the second conductive layer 16b and the sidewall insulating layer 48a from being positioned in the area on the active region 12a. If the second conductive layer 16b and the side wall insulating layer 48a are positioned in the active region 12a, the gate width of the driver transistor $Q_4$ shown in FIG. 18 becomes smaller than the designed value. This causes an imbalance in the β ratio of the memory cell causing the characteristics of the SRAM to deteriorate.

Since the structure of the second embodiment is the same as the first embodiment other than the width of the second conductive layer 16b, the same effect as in the first embodiment can be achieved.

Third Embodiment

Figure 20:
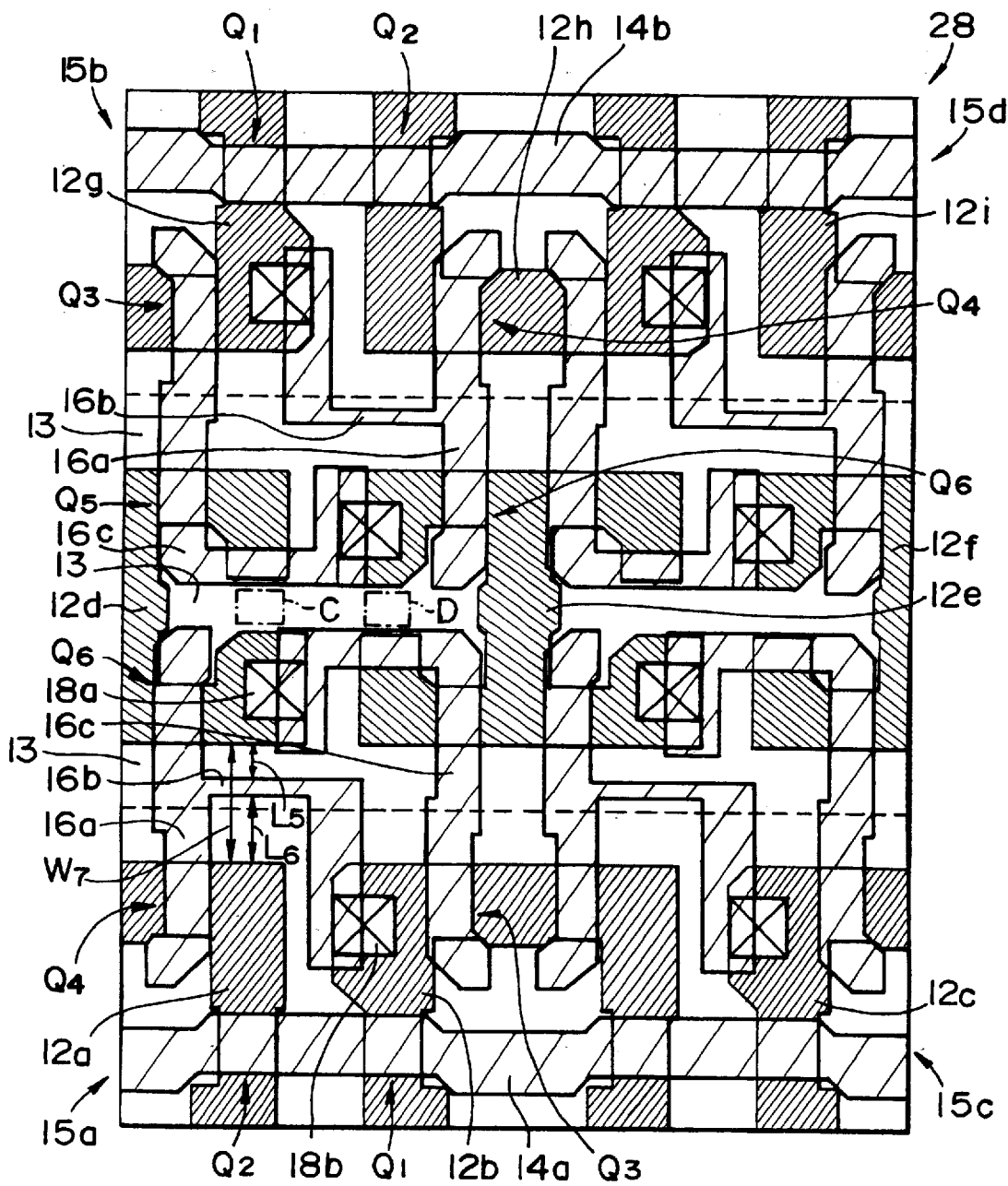
FIG. 20 is a plan view showing a part of an element formation layer of a memory cell array of an SRAM according to a third embodiment of the present invention.

FIG. 20 is a plan view showing part of an element formation layer of a memory cell array of an SRAM according to the third embodiment of the present invention. The third embodiment differs from the second embodiment in terms of the position of the second conductive layer 16b. Specifically, in the third embodiment, a distance $L_5$ between the second conductive layer 16b and the active region 12d is smaller than a distance $L_6$ between the second conductive layer 16b and the active region 12a. Since the structure other than the above distance is the same as in the second embodiment, further description is omitted by using the same reference numerals.

The β ratio of the memory cell is not affected even though the second conductive layer 16b and the side wall insulating layer are positioned in an area on the active region 12d and the gate width of the load transistor $Q_6$ is smaller. Because of this, the distance $L_5$ between the second conductive layer 16b and the active region 12d is smaller than the distance $L_6$ between the second conductive layer 16b and the active region 12a. Therefore, the width W₇ of the field oxide region 13 can be reduced, whereby the memory cell can be miniaturized.

Since the structure of the third embodiment is the same as the second embodiment other than the position of the second conductive layer 16b, the same effect as in the second embodiment can be achieved.

What is claimed is:

1. A semiconductor memory device including: a semiconductor substrate having a main surface; and first and second load transistors and first and second driver transistors formed on the main surface, the semiconductor memory devise comprising:
   (a) first and second memory cells each of which comprises:
   a first load transistor active region formed on the main surface and to be an active region for the first load transistor;
   a second load transistor active region formed on the main surface and to be an active region for the second load transistor;
   a first driver transistor active region formed on the main surface and to be an active region for the first driver transistor;
   a second driver transistor active region formed on the main surface and to be an active region for the second driver transistor;
   a first element isolation region formed on the main surface and isolating the first load transistor active region from the first driver transistor active region;
   a first conductive layer extending from an area on the first load transistor active region to an area on the first driver transistor active region, and to be a gate electrode for the first load transistor and the first driver transistor;
   a second conductive layer which diverges from the first conductive layer on the first element isolation region and is electrically connected to the second driver transistor active region; and
   a third conductive layer being electrically connected to the first load transistor active region and extending to an area on the second driver transistor active region across an area on the second load transistor active region, and to be a gate electrode for the second load transistor and the second driver transistor, and
   (b) a second element isolation region formed on the main surface and isolating the first and second load transistor active regions of the first memory cell from the first and second load transistor active regions of the second memory cell,
   wherein a pattern of the first, second, and third conductive layers of the second memory cell is a rotated pattern of the first, second, and third conductive layers of the first memory cell at an angle of 180 degrees around an axis perpendicular to the main surface.

2. The semiconductor memory device according to claim 1, wherein:
   the second load transistor active region of the first memory cell comprises a first facing region which faces the first load transistor active region of the second memory cell with the second element isolation region interposing therebetween;
   a pattern of the third conductive layer of the first memory cell is formed across an area on the first facing region;
   the second load transistor active region of the second memory cell comprises a second facing region which faces the first load transistor active region of the first memory cell with the second element isolation region interposing therebetween; and
   a pattern of the third conductive layer of the second memory cell is formed across an area on the second facing region.

3. The semiconductor memory device according to claim 2, wherein:
   a first side wall insulating layer is formed on a side of the third conductive layer of the first memory cell;
   the first side wall insulating layer is positioned in an area on the first facing region;
   a second side wall insulating layer is formed on a side of the third conductive layer of the second memory cell; and
   the second side wall insulating layer is positioned in an area on the second facing region.

4. The semiconductor memory device according to claim 2, wherein:
   part of the third conductive layer of the first memory cell is formed on the second element isolation region in the first facing region; and
   part of the third conductive layer of the second memory cell is formed on the second element isolation region in the second facing region.

5. The semiconductor memory device according to claim 1, wherein a pattern of the first and second conductive layers is in a shape of an "h" and a pattern of the third conductive layer is in a shape of a "7".

6. The semiconductor memory device according to claim 2, wherein a pattern of the first and second conductive layers is in a shape of an "h" and a pattern of the third conductive layer is in a shape of a "7".

7. A semiconductor memory device comprising a memory cell array having a plurality of memory cells including first and second load transistors and first and second driver transistors, wherein:
   each of the memory cells comprises:
   a semiconductor substrate having a main surface;
   a first load transistor active region formed on the main surface and to be an active region for the first load transistor;
   a second load transistor active region formed on the main surface and to be an active region for the second load transistor;
   a first driver transistor active region formed on the main surface and to be an active region for the first driver transistor;
   a second driver transistor active region formed on the main surface and to be an active region for the second driver transistor;
   a first element isolation region formed on the main surface and isolating the first load transistor active region from the first driver transistor active region;
   a first conductive layer extending from an area on the first load transistor active region to an area on the first driver transistor active region, and to be a gate electrode for the first load transistor and the first driver transistor;
   a second conductive layer which diverges from the first conductive layer on the first element isolation region and is electrically connected to the second driver transistor active region; and
   a third conductive layer being electrically connected to the first load transistor active region and extending to an area on the second driver transistor active region across an area on the second load transistor active region, and to be a gate electrode for the second load transistor and the second driver transistor, the memory cell array comprises:

first and second lines including the memory cells; and a second element isolation region which isolates the first line from the second line, and a pattern of the first, second, and third conductive layers of each of the memory cells in the second line is a rotated pattern of the first, second, and third conductive layers of each of the memory cells in the first line at an angle of 180 degrees around an axis perpendicular to the main surface.

8. The semiconductor memory device according to claim 7, wherein:

the second load transistor active region of each of the memory cells in the first line comprises a first facing region which faces the first load transistor active region of each of the memory cells in the second line with the second element isolation region interposing therebetween, a pattern of the third conductive layer of each of the memory cells in the first line is formed across an area on the first facing region, the second load transistor active region of each of the memory cells in the second line comprises a second facing region which faces the first load transistor active region of each of the memory cells in the first line with the second element isolation region interposing therebetween, and a pattern of the third conductive layer of each of the memory cells in the second line is formed across an area on the second facing region.

9. The semiconductor memory device according to claim 8, wherein:

a first side wall insulating layer is formed on a side of the third conductive layer of each of the memory cells in the first line;

the first side wall insulating layer is positioned in an area on the first facing region;

a second side wall insulating layer is formed on a side of the third conductive layer of each of the memory cells in the second line; and the second side wall insulating layer is positioned in an area on the second facing region.

10. The semiconductor memory device according to claim 8, wherein:

part of the third conductive layer of each of the memory cells in the first line is formed on the second element isolation region in the first facing region; and part of the third conductive layer of each of the memory cells in the second line is formed on the second element isolation region in the second facing region.

11. The semiconductor memory device according to claim 7, wherein a pattern of the first and second conductive layers is in a shape of an "h" and a pattern of the third conductive layer is in a shape of a "7".

12. The semiconductor memory device according to claim 8, wherein a pattern of the first and second conductive layers is in a shape of an "h" and a pattern of the third conductive layer is in a shape of a "7".

* * * * *